United States Patent
Toyoda et al.

(10) Patent No.: US 6,859,088 B2
(45) Date of Patent: Feb. 22, 2005

(54) FERROELECTRIC ELEMENT AND A FERROELECTRIC GATE DEVICE USING THE SAME

(75) Inventors: Kenji Toyoda, Osaka (JP); Takashi Ohtsuka, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/716,670

(22) Filed: Nov. 20, 2003

(65) Prior Publication Data

US 2004/0109367 A1 Jun. 10, 2004

Related U.S. Application Data

(63) Continuation of application No. PCT/JP03/08951, filed on Jul. 15, 2003.

(30) Foreign Application Priority Data

Jul. 23, 2002 (JP) ........................................ 2002-213399

(51) Int. Cl.$^7$ ............................................. H03K 17/687
(52) U.S. Cl. ...................... 327/427; 327/421; 365/145
(58) Field of Search ............................... 327/365, 427, 327/434, 421, 581; 365/145, 149; 257/295

(56) References Cited

U.S. PATENT DOCUMENTS 5,523,964 A * 6/1996 McMillan et al. .......... 365/145
6,191,441 B1 * 2/2001 Aoki et al. ................. 257/295
2003/0174532 A1 * 9/2003 Matsushita et al. ......... 365/145

FOREIGN PATENT DOCUMENTS

| EP | 0 441 584 A2 | 8/1991 |
| JP | 4-171758 | 6/1992 |
| JP | P2003-173673 A | 6/2003 |

* cited by examiner

Primary Examiner—Long Nguyen
(74) Attorney, Agent, or Firm—McDermott Will & Emery LLP

(57) ABSTRACT

A ferroelectric gate device which comprises a ferroelectric capacitor (1), a switching element (2) serving as a resistor of a capacitor depending on the voltage applied, and a field-effect transistor (6) having a source, a drain and a gate, said ferroelectric capacitor (1) having an input terminal (IN) at one end, the other end of said ferroelectric capacitor (1) being connected to one end of said switching element (2), the other end of said switching element (2) being connected to the gate of said field-effect transistor (6), by applying a voltage to said input terminal, said switching element (2) serving as a resistor when a voltage higher than the coercive voltage (Vc) of a ferroelectric substance which said ferroelectric capacitor (1), and by applying a voltage to said input terminal, said switching element (2) serving as a capacitor when a voltage lower than the coercive voltage (Vc) of said ferroelectric substance is applied to said ferroelectric capacitor (1).

6 Claims, 7 Drawing Sheets

FERROELECTRIC ELEMENT AND A FERROELECTRIC GATE DEVICE USING THE SAME

This is a continuation of copending International Application No. PCT/JP03/08951, filed Jul. 15, 2003, which designated the United States.

BACKGROUND OF THE INVENTION (1) Field of the Invention

The present invention relates to an element and gate device which use a ferroelectric substance, especially to a ferroelectric element having improved dielectric polarization retention and squareness ratio, and a ferroelectric gate device using the same.

(2) Description of the Related Art

The recent developments in electronic devices are driving the need for increasingly larger data capacity. Nonvolatile memories are attracting attention to maintain data after power is turned off. There are several types of nonvolatile memories: flash memory, ferroelectric random-access memory (FeRAM), etc. When handling large amount of data at a high speed, a device may need a non-volatile memory which is still faster than these existing memories. For this reason, ferroelectric gate devices of Metal Ferroelectric Metal Insulator Semiconductor (MFMIS) type are attracting attention recently. An MFMIS type ferroelectric gate device has the problem of the distribution ratio of the voltage applied to a ferroelectric capacitor (ferroelectric thin film) and gate oxide. This problem will be explained with referring to FIG. 10.

FIG. 10(a) is a diagram of a circuit in which a paraelectric capacitor 101 is serially connected to a ferroelectric capacitor 102. The paraelectric capacitor 101 and ferroelectric capacitor 102 shown in FIG. 10(a) represent a gate oxide and a ferroelectric thin film in a ferroelectric gate device, respectively. One terminal of the ferroelectric capacitor 102 is grounded. Now, the voltage Vpp is applied to the terminal IN of the paraelectric capacitor 101. At this time, assume that the voltage at both ends of the ferroelectric capacitor 102 is Vf; the voltage at both ends of the paraelectric capacitor 101 is Vc; and the electric charge induced in each of the paraelectric capacitor 101 and the ferroelectric capacitor 102 is Q. The electric charge Q and voltage Vf of the ferroelectric capacitor 102 indicate the hysteresis characteristic as shown in FIG. 10(b). The relationship between the electric charge Q and voltage Vc of the paraelectric capacitor 101 is expressed as Formula 1.

$$Q = CcVc \quad \text{(Formula 1)}$$
$$= Cc(Vpp - Vf)$$

The point A (see FIG. 10(b)), which is the intersection of the straight line expressed by Formula 1 and the above-mentioned hysteresis curve, is the operating point at this time.

When the voltage of the terminal IN, to which the voltage Vpp of the paraelectric capacitor 101 is applied, is returned to 0 V, the relationship between the electric charge Q and voltage Vc of the paraelectric capacitor 101 is expressed as Formula 2.

$$Q = CcVc \quad \text{(Formula 2)}$$
$$= -CcVf$$

The point B (see FIG. 10(b)), which is the intersection of the straight line expressed by Formula 2 and the above-mentioned hysteresis curve, is the operating point at this time. Since the polarization of the ferroelectric substance of the ferroelectric capacitor 102 is retained, the potential of −Vh is retained at the connection node of the paraelectric capacitor 101 and the ferroelectric capacitor 102.

To increase the retained voltage (−Vh), it is desirable to increase the voltage applied to the ferroelectric capacitor 102. However, when a voltage is applied to the terminal IN, a voltage will be also applied to the paraelectric capacitor 101. Therefore, the degree of the polarization of the ferroelectric substance does not become high enough. If the voltage applied to Terminal IN is too high, the electric field strength of the paraelectric capacitor 101 exceeds the withstand voltage. The coercive voltage can be increased by increasing the squareness ratio M of the ferroelectric substance (=Pr (remanence)/Ps (spontaneous polarization)) (see FIG. 10(b)). To do so, the crystallinity of the ferroelectric thin film must be improved. However, it is difficult to form a crystal of the ferroelectric thin film having the squareness ratio M as high as a bulk crystal of the ferroelectric substance.

As mentioned above, in the circuit where the paraelectric capacitor 101 and ferroelectric capacitor 102 are serially connected, there is a problem that the voltage retained at the connection node of both the capacitors 101 and 102 cannot be increased because it is difficult to apply a sufficiently high voltage only to a ferroelectric capacitor 102, and the squareness ratio of the ferroelectric thin film is not very large.

BRIEF SUMMARY OF THE INVENTION

The object of the present invention is to solve the above-mentioned problems. More specifically, the present invention aims to provide a ferroelectric element in which a switching element serving as a resistor or a capacitor depending on a voltage applied to the switching element is serially connected to a ferroelectric capacitor, and a ferroelectric gate device using the same.

A first ferroelectric element of the present invention which achieves the above-mentioned object comprises a ferroelectric capacitor and a switching element serially connected to said ferroelectric capacitor; said switching element comprising a zener diode; when a voltage is applied between both terminals of said ferroelectric element, said switching element serving as a resistor if a voltage higher than the coercive voltage of a ferroelectric substance which said ferroelectric capacitor comprises is applied to said ferroelectric capacitor; and when a voltage is applied between both terminals of said ferroelectric element, said switching element serving as a capacitor if a voltage lower than the coercive voltage of said ferroelectric substance is applied to said ferroelectric capacitor.

A second ferroelectric element of the present invention which achieves the above-mentioned object comprises a ferroelectric capacitor and a switching element which comprises an N-channel field-effect transistor and a P-channel field-effect transistor and is serially connected to said ferroelectric capacitor; sources of said N-channel and P-channel electric field effect transistors being connected to an input terminal; drains of said N-channel and P-channel field-effect transistors being connected to one end of said ferroelectric capacitor; gates of said N-channel and P-channel field-effect transistors being connected to the other end of said ferroelectric capacitor; when a voltage is applied to both terminals of said ferroelectric element, said switching element serving as a resistor if a voltage higher than the coercive voltage of a ferroelectric substance which said ferroelectric capacitor comprises is applied to said ferroelectric capacitor; and when a voltage is applied to both the terminals of said ferroelectric element, said switching element serving as a capacitor if a voltage lower than said coercive voltage is applied to said ferroelectric capacitor.

A third ferroelectric element of the present invention which achieves the above-mentioned object comprises a ferroelectric capacitor, a switching element serially connected to said ferroelectric capacitor and a paraelectric capacitor serially connected to said ferroelectric capacitor or said switching element; said switching element comprising a zener diode; when a voltage is applied to both terminals of said ferroelectric element, said switching element serving as a resistor if a voltage higher than the coercive voltage of a ferroelectric substance which said ferroelectric capacitor comprises is applied to said ferroelectric capacitor; and when a voltage is applied to both terminals of said ferroelectric element, said switching element serving as a capacitor if a voltage lower than said coercive voltage is applied to said ferroelectric capacitor.

The ferroelectric gate device according to the present invention which achieves the above-mentioned object comprises a ferroelectric capacitor, a switching element and a field-effect transistor having a source, a drain and a gate; said ferroelectric capacitor having an input terminal at one end; the other end of said ferroelectric capacitor being connected to one end of said switching element; the other end of said switching element being connected to the gate of said field-effect transistor; and said switching element comprising a zener diode.

BRIEF DESCRIPTION OF THE SEVERAL VIEWS OF THE DRAWING

FIG. 10($a$) is the diagram of a circuit in which a ferroelectric capacitor and a paraelectric capacitor are serially connected; and FIG. 10($b$) is a drawing for illustrating the operation of the circuit shown in FIG. 10($a$).

DETAILED DESCRIPTION OF THE INVENTION

Below, the embodiments of the ferroelectric element according to the present invention and the ferroelectric gate device using the same are explained with referring to the accompanying drawings. In this specification, the phrase "gate device" means a switching element represented by a field-effect transistor. Specifically, the switching element means an element in which current flow is caused between its source and drain when ON voltage is applied to its gate, whereas current flow between its source and drain is substantially stopped when OFF voltage is applied to its gate. (First Embodiment of the Ferroelectric Element According to the Present Invention)

Figure 1:
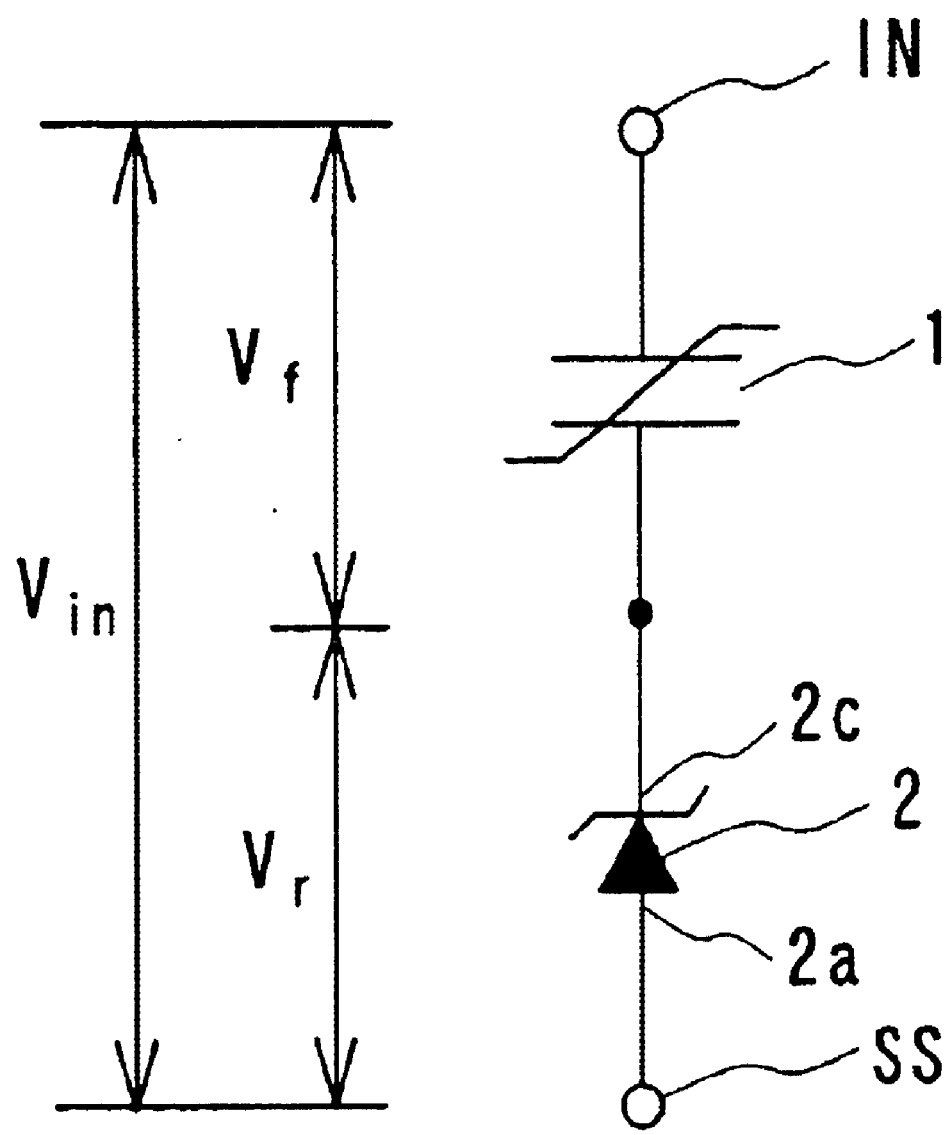
FIG. 1 is a circuit diagram of a first embodiment of the ferroelectric element according to the present invention.

FIG. 1 is a circuit diagram of the first embodiment of the ferroelectric element according to the present invention. As shown in FIG. 1, the ferroelectric element according to this embodiment comprises a ferroelectric capacitor 1 and a switching element 2 which are connected serially. The switching element 2 is a zener diode. A zener diode shows the voltage-current characteristics of a normal diode when a forward-biased voltage is applied, while it keeps a voltage between its terminals constant when a reverse-current flows. The switching element 2 has a cathode 2$c$ and an anode 2$a$. The cathode 2$c$ is connected to the ferroelectric capacitor 1, while the anode. 2$a$ is connected to a terminal SS. The zener diode (switching element 2) can be treated as an element having a characteristics similar to a switch. That is, the diode serves as a resistor when the voltage applied is higher than a predetermined level, while it serves as a capacitor when the voltage applied is lower than the predetermined level. The terminal SS of the switching element 2 is grounded and a voltage Vin is applied to the terminal IN of the ferroelectric capacitor 1. In the explanation below, the voltage between both ends of the ferroelectric capacitor 1 is Vf and the voltage between both ends of the switching element 2 is Vr. As a ferroelectric substance of the ferroelectric capacitor 1, for example, strontium bismuth tantalate (Y1:$SrBi_2Ta_2O_9$) can be used.

Figure 2:
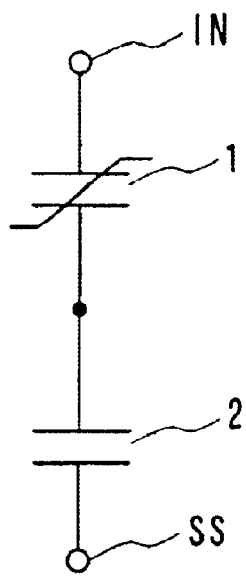
FIG. 2 is a drawing for illustrating the operation of the ferroelectric element of FIG. 1.
Figure 2:
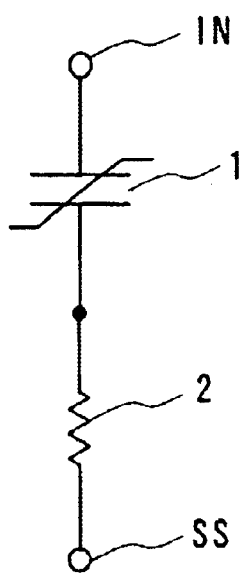

The operation of the switching element 2 is specifically explained with referring to FIGS. 2($a$) and 2($b$). The switching element 2 serves as a capacitor or a resistor depending on the voltage Vin applied to the input terminal IN and the voltage Vf between both ends of the ferroelectric capacitor 1. More specifically, the switching element 2 serves as a capacitor when the voltage Vf is lower than the coercive voltage Vc of the ferroelectric substance of the ferroelectric capacitor 1, while it serves as a resistor when the voltage Vf is higher than the coercive voltage Vc. In other words, the switching element 2 is designed to have such characteristics. Therefore, the circuit diagram of the ferroelectric element of FIG. 1 is equivalent to that of FIG. 2($a$) when Vf<Vc, while it is equivalent to that of FIG. 2($b$) when Vf≧Vc.

When the voltage Vin applied to the input terminal IN is sufficiently higher than the coercive voltage Vc, the voltage higher than the coercive voltage Vc is applied to the ferroelectric capacitor 1. In this case, as already stated, the switching element 2 serves as a resistor. Therefore, the voltage Vf between both ends of the ferroelectric capacitor 1 becomes equal to the applied voltage Vin. Specifically, the voltage Vf (=Vin>Vc) which is higher than the coercive voltage Vc is applied to the ferroelectric capacitor 1. This voltage sufficiently induces the polarization of the ferroelectric substance of the ferroelectric capacitor 1. When the voltage Vin applied to the input terminal IN is lower than the coercive voltage Vc, so is the voltage applied to the ferroelectric capacitor 1. In this case, the switching element 2 serves as a capacitor, as already stated. This characteristic of the switching element 2 enables retaining the polarization of the ferroelectric substance of the ferroelectric capacitor 1 when a high voltage is applied to the input terminal IN to induce the polarization in the ferroelectric substance of the ferroelectric capacitor 1, and then the voltage Vin is reduced so that the switching element 2 starts to serve as a capacitor. Accordingly the squareness ratio of the ferroelectric capacitor 1 is increased.

Figure 3:
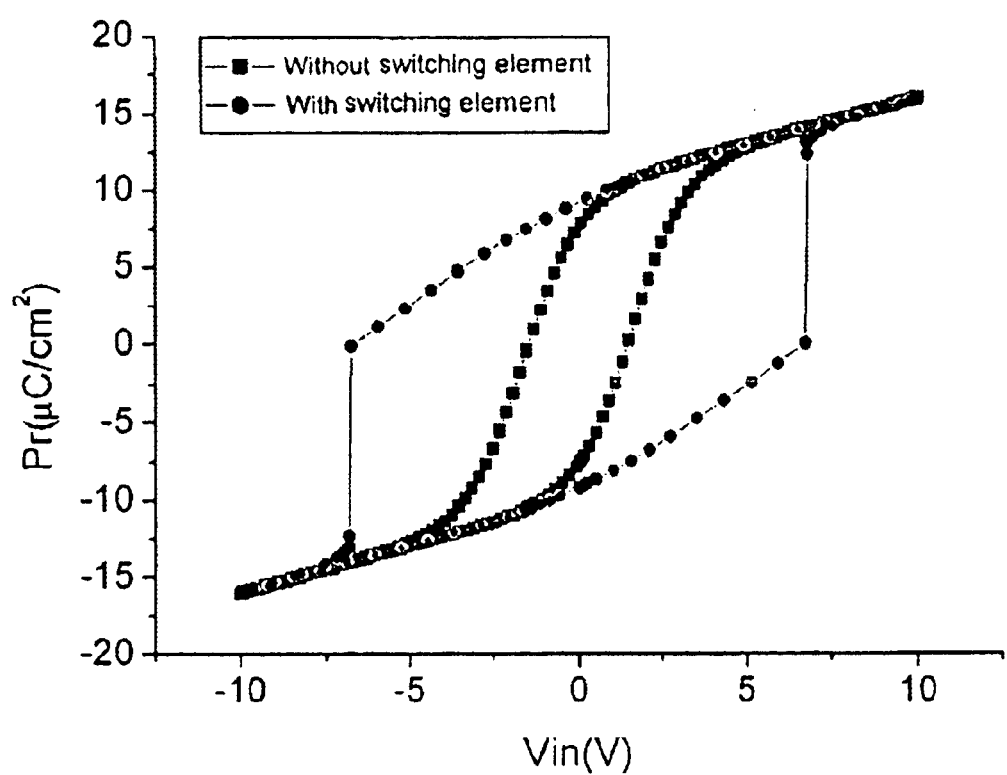
FIG. 3 is a drawing which shows the simulation result of the relationship between the dielectric polarization and applied voltage in the ferroelectric element of FIG. 1.

A simulation was performed to confirm these improvements in characteristics. FIG. 3 shows the simulation result of the polarization Pr induced in the ferroelectric substance of the ferroelectric capacitor 1. The conditions of the simulation were as follows: the resistance value of the switching element 2 while serving as a resistor was 100 Ω; the capacitance of the switching element 2 while serving as a capacitor was 10 pF; the coercive voltage Vc of the ferroelectric substance of the ferroelectric capacitor 1 was 1.5 V; and the voltage ranging from −10 V to 10 V was applied to the input terminal IN.

FIG. 3 shows the relationship between the voltage Vin applied to the input terminal IN and the polarization Pr induced by the voltage Vin in two types of elements: the ferroelectric element equipped with the switching device 2 according to this embodiment and the element consisting only of ferroelectric capacitor 1 and not equipped with the switching device 2. As seen from FIG. 3, when the applied voltage Vin was increased from 0 V, the polarization of the ferroelectric element according to this embodiment was reversed at about 6 V. Considering that the coercive voltage Vc of the ferroelectric capacitor 1 was 1.5 V, the result reveals that the polarization retention characteristics of the ferroelectric element according to this embodiment have been improved. In addition, the ferroelectric capacitor 1 which is not provided with the switching element 2 showed the squareness ratio of 0.77. In comparison, the ferroelectric element according to this embodiment showed a much higher ratio, 0.92.

As mentioned above, connecting of the switching element 2 to the ferroelectric capacitor 1 serially enabled inducing the polarization in the ferroelectric substance of the ferroelectric capacitor 1 at a low input voltage. This also improved the polarization retention characteristics of the ferroelectric substance of the ferroelectric capacitor 1. Furthermore, the squareness ratio of the ferroelectric element was greatly increased.

The switching element 2 will perform as long as it fulfills the following two conditions: 1) it is an element whose current value changes steeply in the vicinity of a predetermined voltage value (threshold voltage value); and 2) it is designed to have such a threshold voltage that it behaves as a resistor or a capacitor depending on the order of the voltage values (the voltage Vf applied to the ferroelectric capacitor, to which it is serially connected, and the coercive voltage Vc), as described above.

Although Y1 was used as the ferroelectric substance of the ferroelectric capacitor 1 above, any kind of material can be used as long as the material has a hysteresis characteristics in polarization. For example, the ferroelectric element may comprise bismuth titanate, lead titanate or the like; high molecular compounds, such as polyvinylidene fluoride-ethylene trifluoride copolymer (P (VDF/TrFE)), which maintain data by using the uneven distribution of electric charge. The use of these substances produces similar effects to the above.

Described above is the case where the terminal SS of the switching element 2 is grounded and the voltage Vin is applied to the terminal IN of the ferroelectric capacitor 1. However, the terminal IN may be grounded and the voltage Vin may be applied to the terminal SS. This condition can also produce similar effects to the above.

(Second Embodiment of the Ferroelectric Element According to the Present Invention)

Figure 4:
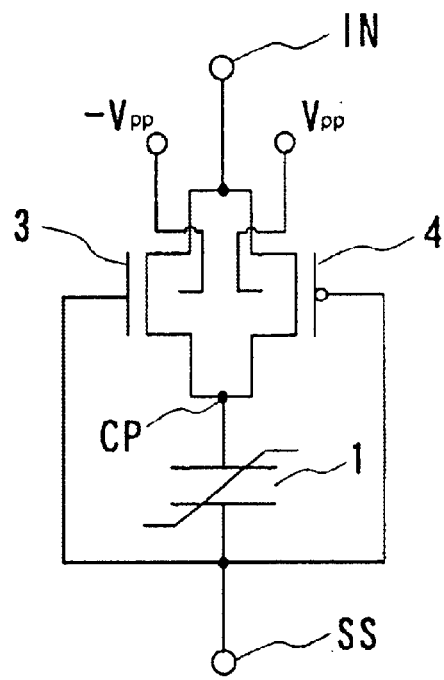
FIG. 4 is a circuit diagram of a second embodiment of the ferroelectric element according to the present invention.
Figure 5:
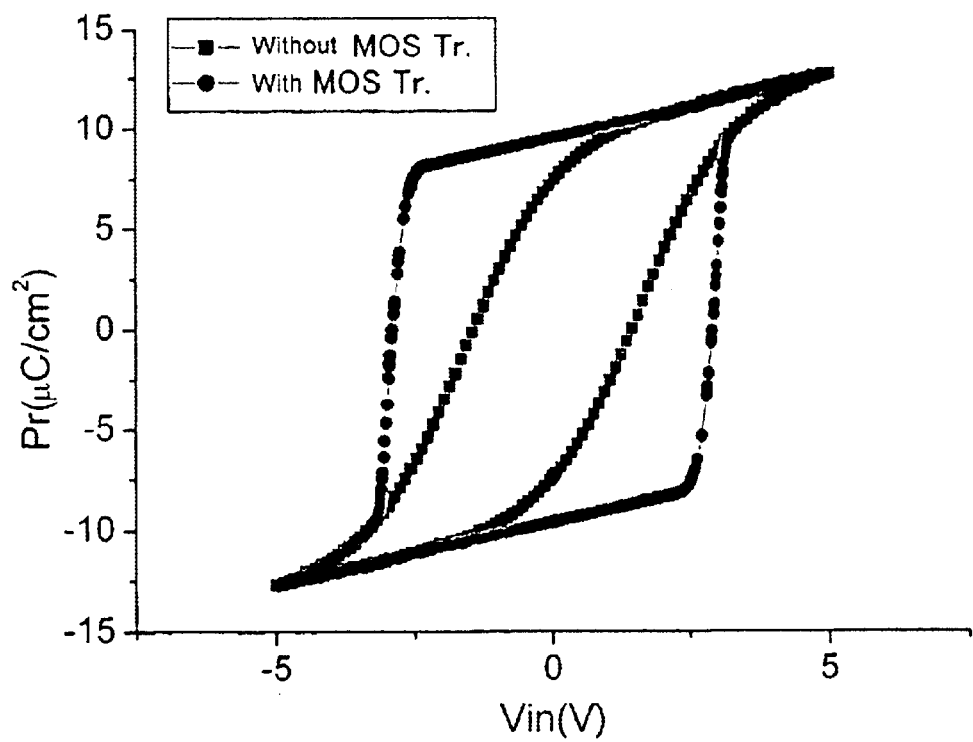
FIG. 5 is a drawing showing the simulation result of the relationship between the dielectric polarization and applied voltage in the ferroelectric element of FIG. 4.

FIG. 4 is a circuit diagram of the second embodiment of the ferroelectric element according to the present invention. The ferroelectric element of this embodiment comprises a ferroelectric capacitor 1 and a switching element which are serially connected. The switching element is constructed from an N-channel MOS transistor 3 and a P-channel MOS transistor 4. The N-channel MOS transistor 3 is an N-channel field-effect transistor, and the P-channel MOS transistor 4 is a P-channel field-effect transistor. One end of the ferroelectric capacitor 1 and the drains of the N-channel MOS transistor 3 and the P-channel MOS transistor 4 are connected to a connection node CP. The other end of the ferroelectric capacitor 1, the gate of the N-channel MOS transistor 3 and the gate of the P-channel MOS transistor 4 are connected to a terminal SS. The sources of the N-channel MOS transistor 3 and the P-channel MOS transistor 4 are connected to an input terminal IN. The terminal SS is grounded. The values of the threshold voltage of the N-channel and P-channel MOS transistors 3 and 4 are set equal to the coercive voltage Vc of the ferroelectric substance of the ferroelectric capacitor 1. The voltage of the substrate provided with the N-channel MOS transistor 3 is set at −VPP. The voltage of the substrate provided with the P-channel MOS transistor 4 is set at Vpp. Vpp represents the maximum value of the voltage inputted into the input terminal IN. Setting the voltage of each substrate at Vpp or −Vpp is for preventing a forward current of a pn junction. The limit values of the voltage inputted into the input terminal IN are those needed to sufficiently saturate the polarization. Examples of the values are indicated in FIG. 5, as the voltages of −5 V and 5 V. That is, the limit values of the voltage inputted into the input terminal IN are the values corresponding to the points where a pair of hysteresis curves shown in FIG. 5 meet.

In the description below, Vin represents the voltage applied to the input terminal IN and Vf represents the voltage between both ends of the ferroelectric capacitor 1, as in the first embodiment. As the ferroelectric substance of the ferroelectric capacitor 1, for example, strontium bismuth tantalate (Y1:$SrBi_2Ta_2O_9$) can be used.

The N-channel MOS transistor 3 and P-channel MOS transistor 4 are designed to operate as follows: when the voltage Vf between both ends of the ferroelectric capacitor 1 is not lower than Vc, the N-channel MOS transistor 3 is turned on; when the voltage Vf is not higher than −Vc, the P-channel MOS transistor 4 is turned on; and when the voltage Vf is higher than −Vc but lower than Vc, both of the MOS transistors 3 and 4 are turned off. In other words, the switching element comprising the N-channel MOS transistor 3 and P-channel MOS transistor 4 serves as a resistor when $Vf \geq Vc$ or $Vf \leq -Vc$, whereas it serves as a capacitor when $-Vc < Vf < Vc$. Therefore, the effects similar to those produced by the ferroelectric element according to the first embodiment are obtained.

A simulation was performed to confirm these effects. FIG. 5 shows the analysis result of the polarization induced in the ferroelectric capacitor 1. The conditions of the simulation were as follows: the coercive voltage Vc of the ferroelectric substance of the ferroelectric capacitor 1 was 1.5 V; and the voltage applied to the input terminal IN was ranging from −5 V to 5 V. FIG. 5 shows the relationship between the voltage Vin applied to the input terminal IN and the polarization Pr induced in a ferroelectric substance in two types of elements: the ferroelectric element according to this embodiment and the element consisting only of ferroelectric capacitor 1. The former is provided with the switching element comprising the N-channel and P-channel MOS transistors 3 and 4, while the latter is not provided with a switching element. As seen from FIG. 5, when the applied voltage Vin was increased from 0 V, the polarization of the ferroelectric element according to this embodiment was reversed at about 3 V. Considering that the coercive voltage Vc of the ferroelectric capacitor 1 was 1.5 V in the simulation, it can be seen that the ferroelectric element according to this embodiment has a higher polarization retention characteristics. This results in a much higher squareness ratio of the ferroelectric element according to this embodiment, 0.95, compared to 0.77 of the ferroelectric capacitor which is not provided with a switching element.

As mentioned above, serially connecting the switching element, which comprises the N-channel and P-channel MOS transistors 3 and 4, to the ferroelectric capacitor 1 produces effects similar to those produced by the ferroelectric element of the first embodiment. Such ferroelectric capacitor 1 has the greatly improved retention characteristics of dielectric polarization and squareness ratio.

Above, Y1 was used as the ferroelectric substance of the ferroelectric capacitor 1. However, any material which has a hysteresis characteristics in polarization can be used to construct the ferroelectric element. Examples of such materials include bismuth titanate, lead titanate and high molecular compounds, such as polyvinylidene fluoride-ethylene trifluoride copolymer (P (VDF/TrFE)), which retain data using the uneven distribution of an electric charge. The ferroelectric element constructed using such a material produces the effects similar to the above.

(Third Embodiment of the Ferroelectric Element According to the Present Invention)

Figure 6:
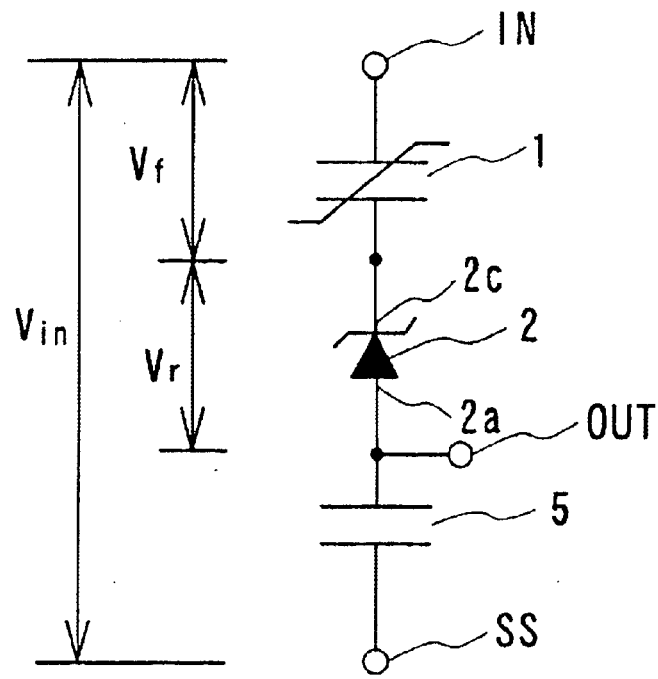
FIG. 6 is a circuit diagram of a third embodiment of the ferroelectric element according to the present invention.

FIG. 6 is a circuit diagram of a third embodiment of the ferroelectric element according to the present invention. As shown in FIG. 6, the ferroelectric element according to this embodiment comprises the ferroelectric element according to the first embodiment shown in FIG. 1 and a paraelectric capacitor 5, which are connected serially. The terminal IN of the ferroelectric capacitor 1 is an input terminal to which a predetermined voltage Vin is applied. The terminal SS at the side of the paraelectric capacitor 5 is grounded. An output terminal OUT is provided at the connection node of a switching element 2 and the paraelectric capacitor 5. The capacitance of the paraelectric capacitor 5 is, for example, 10 pF. The ferroelectric substance of the ferroelectric capacitor 1 is, for example, strontium bismuth tantalate (Y1:$SrBi_2Ta_2O_9$).

When the voltage Vin applied to the input terminal IN is sufficiently higher than the coercive voltage Vc of the ferroelectric substance of the ferroelectric capacitor 1, a voltage greater than the coercive voltage Vc is applied to the ferroelectric capacitor 1. Thus, as explained in the description of the first embodiment, the switching element 2 serves as a resistor. For this reason, the voltage between the input terminal IN and output terminal OUT is applied only to the ferroelectric capacitor 1. This induces sufficient polarization in the ferroelectric substance of the ferroelectric capacitor 1. When the voltage Vin applied to the input terminal IN is lower than the coercive voltage Vc, only a voltage lower than Vc is applied to the ferroelectric capacitor 1. Therefore, the switching element 2 serves as a capacitor. Specifically, when a high voltage is applied to the input terminal IN to induce polarization in the ferroelectric substance in the ferroelectric capacitor 1, and then the voltage Vin is reduced, the switching element 2 serves as a capacitor and the polarization in the ferroelectric substance of the ferroelectric capacitor 1 is maintained. Accordingly, the squareness ratio is increased. This also increases the voltage maintained at the output terminal OUT.

Figure 7:
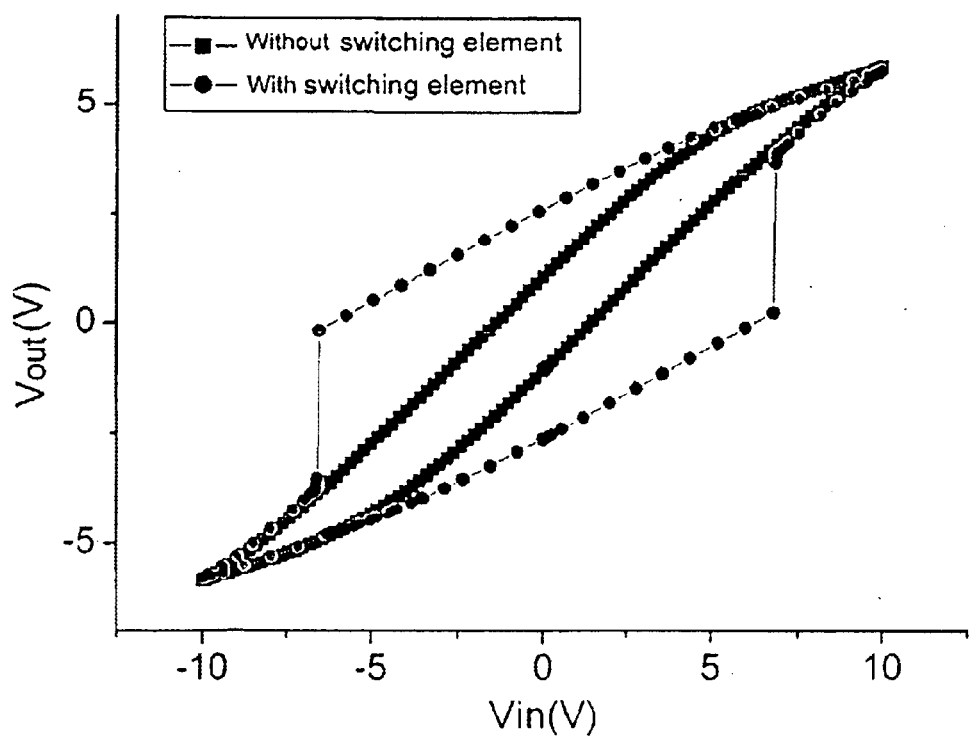
FIG. 7 is a drawing which shows the simulation result of the relationship between the applied voltage and output voltage in the ferroelectric element of FIG. 6.

A simulation was performed in order to confirm these improvements in characteristics. FIG. 7 shows the simulation result of the voltage Vout of the output terminal OUT. The simulation was performed under the following conditions: the resistance value of the switching element 2 while serving as a resistor was 100 Ω; the capacitance of the switching element 2 while serving as a capacitor was 10 pF; the capacitance of the paraelectric capacitor 5 was 10 pF; the coercive voltage Vc of the ferroelectric substance of the ferroelectric capacitor 1 was 1.5 V; and the voltage applied to the input terminal IN was ranging from −10 V to 10 V.

FIG. 7 shows the relationship between the voltage Vin applied to an input terminal IN and the voltage Vout of an output terminal OUT in two circuits: the circuit of ferroelectric element according to this embodiment and a circuit comprising the ferroelectric capacitor 1 and the paraelectric capacitor 5 which are connected serially. The former comprises the switching element 2, while the latter does not. As seen from FIG. 7, when the voltage Vin applied to the input terminal IN is 0 V, the voltage retained at the ferroelectric elements, i.e., the voltages Vout maintained at the terminal OUT, is about 1.1 V in the circuit comprising the ferroelectric capacitor 1 and the paraelectric capacitor 5, which is not provided with the switching element 2, while it is as high as about 2.6 V in the ferroelectric element according to this embodiment. This is because the squareness ratio is increased by serially connecting the switching element 2 to the ferroelectric capacitor 1, as explained in connection with the ferroelectric element according to the first embodiment.

As mentioned above, the paraelectric capacitor 5 is serially connected to the switching element 2 of the ferroelectric element according to the first embodiment. Thus-constructed circuit forms another ferroelectric element as a whole. This arrangement can increase the voltage Vout retained at the connecting terminal OUT between the switching element 2 and the paraelectric capacitor 5.

Explained above is the case where the switching element 2 and the paraelectric capacitor 5 are connected. However, the ferroelectric capacitor 1 and the switching element 2 may be interchanged, the ferroelectric capacitor 1 and the paraelectric capacitor 5 may be connected, and their connection node may be used as the output terminal OUT. Alternatively, the ferroelectric capacitor 1 and the switching element 2, with their positional relationship maintained, may be interchanged with the paraelectric capacitor 5, the ferroelectric capacitor 1 may be connected to the paraelectric capacitor 5, and their connection node may be used as the output terminal OUT. Further, the ferroelectric capacitor 1 may be interchanged with the switching element 2, the ferroelectric capacitor 1 and the switching element 2 may be interchanged with the paraelectric capacitor 5, the switching element 2 may be connected to the paraelectric capacitor 5, and their connection node may be used as the output terminal OUT. Any of these arrangements can produce effects similar to those mentioned above.

(An Embodiment of the Ferroelectric Gate Device According to the Present Invention)

Figure 8:
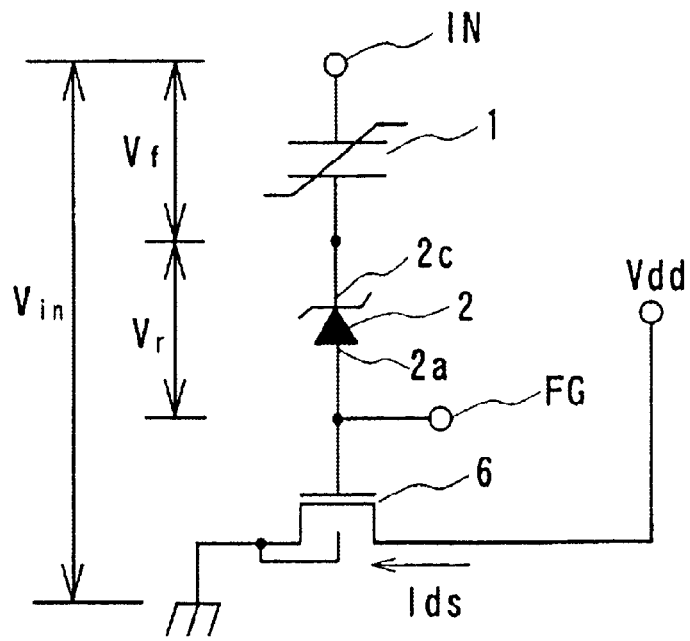
FIG. 8 is a circuit diagram showing one embodiment of the ferroelectric gate device according to the present invention.

FIG. 8 is a circuit diagram showing one embodiment of the ferroelectric gate device of the invention. The gate device according to this embodiment comprises the ferroelectric element shown in FIG. 1 and a MOS transistor 6. The ferroelectric element comprises a zener diode, i.e., a switching element 2, whose anode 2a is connected to the gate of the transistor. A terminal FG is provided at the connection node of the switching element 2 and the gate of the MOS transistor 6. The supply voltage Vdd of 1.0 V is applied to the drain of the MOS transistor 6. The source and substrate of the MOS transistor 6 are grounded. An example of transistors which are usable as the MOS transistor 6 is an N-channel MOS transistor having a gate length of 0.5 $\mu$m, a gate width of 5 $\mu$m and a threshold voltage 0.6 V. An example of materials which are usable as a ferroelectric substance in the ferroelectric capacitor 1 is strontium bismuth tantalate (Y1:$SrBi_2Ta_2O_9$). The area of a ferroelectric substance can be about 1/10 the area of the gate of the MOS transistor 6.

Figure 9:
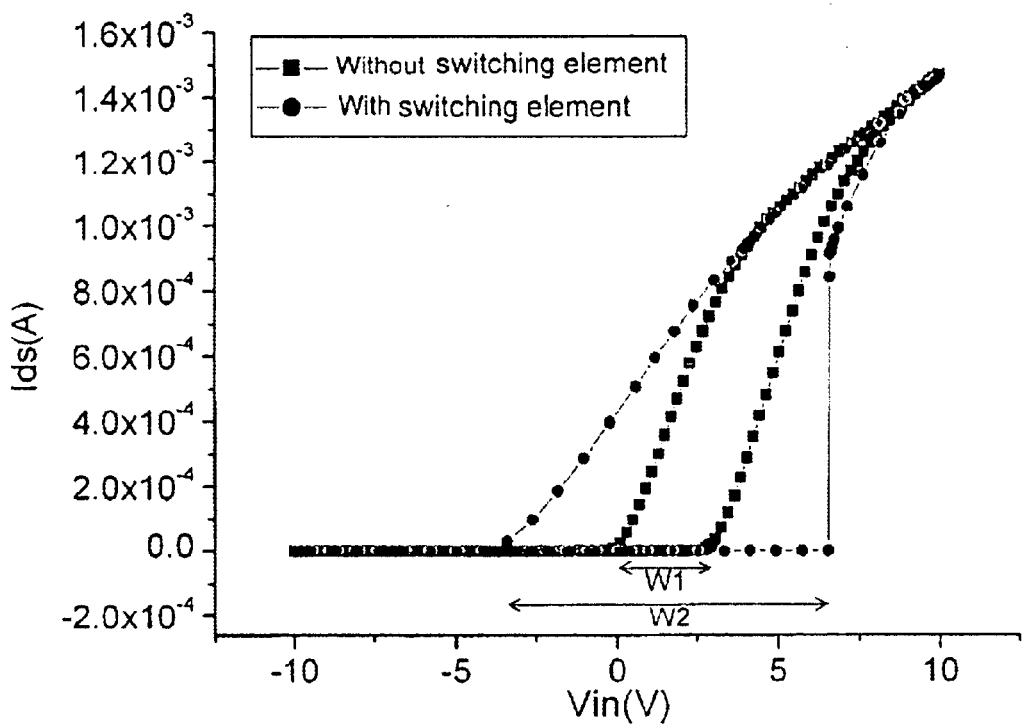
FIG. 9 is a drawing which shows the simulation result of the relationship between the drain current and applied voltage in the ferroelectric gate device of FIG. 8.
Figure 10:
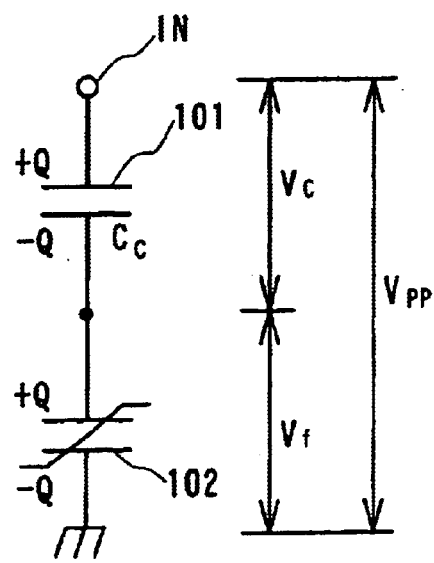
FIGS. 10($a$) and ($b$) are the drawings for illustrating prior art.
Figure 10:
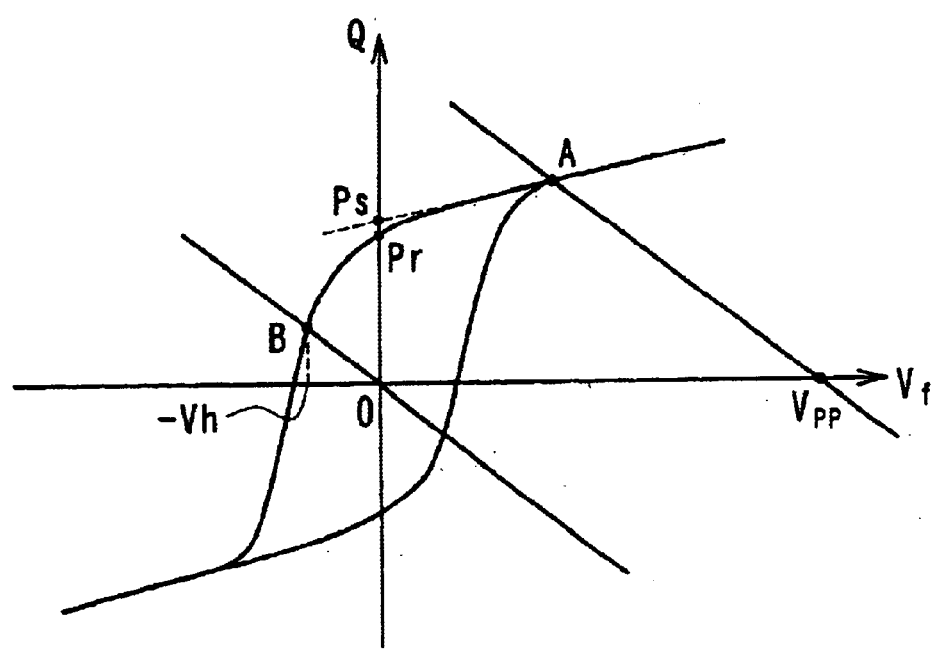

A simulation was performed in order to analyze the drain current Ids of the MOS transistor 6. FIG. 9 shows the result of the simulation. The simulation was performed under the following conditions: the resistance value of the switching element 2 while serving as a resistor was 100 $\Omega$; the capacitance of the switching element 2 while serving as a capacitor was 10 pF; the coercive voltage Vc of the ferroelectric substance of the ferroelectric capacitor 1 was 1.5 V; and the voltage applied to the input terminal IN was ranging from $-10$ V to 10 V.

FIG. 9 shows the relationship between the voltage Vin applied to the input terminal IN and the drain current Ids in two gate devices: the ferroelectric gate device according to this embodiment, and a conventional gate device having an MFMIS structure. The former is provided with the switching element 2, while the latter is not, but only the ferroelectric capacitor 1 is connected to its gate. As seen from FIG. 9, the memory window W1 of the conventional gate device having an MFMIS structure was about 3.1 V, while the memory window W2 of the ferroelectric gate device according to this embodiment was as high as about 10.7 V. This is because of the same reason explained above with regard to the third embodiment of the ferroelectric element according to the present invention. Namely, it is because the ferroelectric gate device according to this embodiment has an increased voltage retained at the terminal FG, which gives the gate device a broader variable range of the threshold voltage of the MOS transistor 6 than that of the conventional device with an MFMIS structure.

The memory window W2 of the ferroelectric gate device according to this embodiment is preferably twice to fifth as high as the memory window W1 of the conventional gate device having an MFMIS structure. If this ratio is less than twice, the effects of the invention cannot be fully exerted, while the ratio higher than fifth may be difficult to achieve in terms of design.

As mentioned above, the ferroelectric gate device according to this embodiment has a larger memory window than the conventional gate device having an MFMIS structure.

Explained above is the case where the switching element 2 is connected to the gate of the MOS transistor 6. However, the ferroelectric capacitor 1 and the switching element 2 may be interchanged; the ferroelectric capacitor 1 may be connected to the gate of the MOS transistor 6; and their connection node may be used as the terminal FG. This arrangement can also produce effects similar to those mentioned above.

Industrial Applicability

The present invention can provide a ferroelectric element which can induce polarization in its ferroelectric substance with a lower input voltage than conventional devices and has improved ferroelectric polarization retention characteristics and squareness ratio. Using this ferroelectric element for a gate device enables inducing polarization in a ferroelectric substance with a lower input voltage than in conventional MFMIS type ferroelectric gate devices. Thus, a ferroelectric gate device having improved dielectric polarization retention characteristics, squareness ratio and memory window can be provided.

What is claimed is:

1. A ferroelectric gate device which comprises:
   a ferroelectric capacitor;
   a switching element; and
   a field-effect transistor having a source, a drain and a gate;
   said ferroelectric capacitor having an input terminal at one end,
   the other end of said ferroelectric capacitor being connected to one end of said switching element,
   the other end of said switching element being connected to the gate of said field-effect transistor, and
   said switching element being a zener diode.

2. A ferroelectric gate device according to claim 1, wherein when a voltage is applied to said input terminal, said switching element serves as a resistor if the voltage higher than a predetermined voltage of a ferroelectric substance which said ferroelectric capacitor comprises is applied to said ferroelectric capacitor, and
   when the voltage is applied to said input terminal, said switching element serves as a capacitor if the voltage lower than the predetermined voltage of said ferroelectric substance is applied to said ferroelectric capacitor.

3. A ferroelectric gate device according to claim 1, wherein the anode of said zener diode is connected to the gate of said field-effect transistor, and
   the cathode of said zener diode is connected to the other end of said ferroelectric capacitor.

4. A ferroelectric gate device according to claim 1, wherein said field-effect transistor is a MOS transistor.

5. A ferroelectric gate device according to claim 1, wherein said ferroelectric capacitor comprises one ferroelectric material selected from the group consisting of strontium bismuth tantalate, bismuth titanate, lead titanate and polyvinylidene fluoride-ethylene trifluoride copolymer.

6. A ferroelectric gate device according to claim 1, wherein said ferroelectric capacitor comprises strontium bismuth tantalate as a ferroelectric material, and
   the area of said ferroelectric material being about 1/10 the area of said gate.

* * * * *